United States Patent [19]

Adamski et al.

[11] Patent Number: 4,783,320

[45] Date of Patent: Nov. 8, 1988

[54] RAPID SYNTHESIS OF INDIUM PHOSPHIDE

[75] Inventors: Joseph A. Adamski, Framingham; Brian S. Ahern, Boxboro, both of Mass.

[73] Assignee: The United States of America as represented by the Secretary of the Air force, Washington, D.C.

[21] Appl. No.: 801,348

[22] Filed: Nov. 25, 1985

[51] Int. Cl.[4] .......................... C30B 25/08; C30B 25/16

[52] U.S. Cl. .......................... 422/245; 118/724; 156/DIG. 70

[58] Field of Search .......................... 422/245, 247; 118/724; 156/610, 613, 614, DIG. 70; 423/299

[56] References Cited

U.S. PATENT DOCUMENTS

| | | | |
|---|---|---|---|
| 3,224,911 | 12/1965 | Williams et al. | 156/614 |
| 3,269,878 | 8/1966 | Wenzel et al. | 148/175 |
| 3,877,883 | 4/1975 | Berkman et al. | 23/301 SP |
| 3,888,705 | 6/1975 | Fletcher et al. | 148/175 |
| 4,035,154 | 7/1977 | Raab et al. | 23/273 SP |
| 4,086,109 | 4/1978 | Hallais | 148/175 |
| 4,094,268 | 6/1978 | Schieber et al. | 422/245 |
| 4,162,293 | 7/1979 | Zeuch | 156/613 |
| 4,185,081 | 1/1980 | Fauth et al. | 423/299 |

FOREIGN PATENT DOCUMENTS

| | | | |
|---|---|---|---|
| 60-155596 | 8/1985 | Japan | 422/245 |

OTHER PUBLICATIONS

Adamski, J. A., Synthesis of Indium Phosphide, *Journal of Crystal Growth,* 64 (1983), pp. 1 to 9.

*Primary Examiner*—John Doll
*Assistant Examiner*—Robert M. Kunemund
*Attorney, Agent, or Firm*—Stanton E. Collier; Donald J. Singer

[57] ABSTRACT

A process for the high pressure synthesis of InP using an independent temperature control of a three zone furnace incorporating a heat pipe provides a stable temperature profile throughout the synthesis cycle. Internal/external pressure control of the quartz ampoule is maintained by use of a water cooled baffle and a temperature/pressure balancing program. Complete synthesis is achieved in less than five hours.

1 Claim, 3 Drawing Sheets

WATER COOLING BAFFLE
HEAT PIPE
10
32 14 22 26 44 34
38 16 24 18 28 42 20 30 40 46 12

TEMPERATURE °C
1200
1000
800
600
400
200
0
SOAK
GRADIENT FREEZE
18°C/HR
POWER
SHUT OFF
1090°C INDIUM BOAT
16
HOURS
PRESSURE=350 PSI,N2
540°C PHOSPHOROUS
RESERVOIR
1
3
5
7
9
11
13
TIME (HOURS)
350
250
150
50PSI
PRESSURE,N2

RAPID SYNTHESIS OF INDIUM PHOSPHIDE

STATEMENT OF GOVERNMENT INTEREST

The invention described herein may be manufactured and used by or for the Government for governmental purposes without the payment of any royalty thereon.

BACKGROUND OF THE INVENTION

This invention relates to an improved method for fabricating a highly pure, crystalline semiconductor material having stoichiometric proportions. More particularly, this invention concerns itself with an improved method for producing highly pure, stoichiometric indium phosphide crystalline materials (which are especially useful as substrates for epitaxy procedures) in a rapid manner as compared with past procedures.

Indium phosphide, a group III–V semiconductor compound, has been found to be especially useful in two areas of technical interest. Its large band gap (1.35 eV) and high electron mobility make it useful as a semiconductor material, especially when employed in its highly pure form, and as a crystalline substrate for device fabrication by epitaxial deposition techniques. Thin film InP devices have great potential for use in integrated optic applications and high frequency microwave devices. However, it is extremely difficult to synthesize indium phosphide to the degree of purity necessary for its successful utilization as a thin film device.

A number of methods have been suggested for synthesizing indium phosphide. One method for growing fairly large crystals involves the direct reaction of elemental phosphorus with elemental indium. This method offers the advantage of producing a relatively pure product since there is no possibility of contamination by other reactants. Unfortunately, the reaction often leads to a large pressure buildup with a resulting explosive potential. This method requires small, strongly sealed containers or bombs and is an expensive and dangerous method for conducting the reaction. Reaction methods involving compounds of indium and phosphorus, rather than elemental reactants, have also been suggested, but the resulting indium phosphide has often been lacking in the degree of purity needed to grow good single crystals.

Another method which has proven successful in producing a highly pure product involves transporting phosphorus in the vapor phase from a source of molten red phosphorus in a first zone of a reaction vessel to a source of molten indium positioned in a second zone of the vessel which is thermally isolated from the first zone. This allows a reaction to occur at a controlled rate without overheating the phosphorus. Although this method provides a highly pure product, it nevertheless still suffers from a pressure control standpoint in which explosions often occur during heating and cooling of the reaction vessel. A quartz ampoule is generally utilized as the reaction vessel and it was found that indium rich indium phosphide wetted and cracked the quartz. Then, the resulting high pressure of the phosphorus would cause the cracked quartz ampoule to explode.

In order to counter the high pressure buildup in the ampoule, the ampoule and furnace can be placed inside of a pressure chamber. This requires that the pressure inside the ampoule be balanced to that in the chamber during heating and cooling. A pressure balancing technique using a quartz bellows to measure the pressure differential across the wall of the ampoule was found to be too complicated and difficult to use reproducibly. High pressure synthesis of volatile chemicals is complicated by the large heat transfer coefficient of the high pressure gas in the pressure chamber. Passive temperature/pressure control by thick layers of insulation was found to be ineffective and explosion of the ampoules was inevitable.

SUMMARY OF THE INVENTION

The present invention overcomes the problems encountered in the past and described herein by providing an improved process and an apparatus which is capable of accurately balancing a differential pressure and as a direct result thereof allows for the rapid formation of high quality indium phosphide and other Group III–V compounds.

A quartz ampoule containing a convection and radiation baffle between an indium heating and the phosphorus heating zone is horizontally positioned in a tubular furnace. Positioned about the quartz ampoule, in sequence, are a first heating coil, a second heating coil, a first insulation baffle, a water cooled baffle, a second insulation baffle, and a third heating coil with a heat pipe inside thereof near the quartz ampoule. The first and second heating coils establish a temperature profile for the indium and the third heating coil independently establishes a temperature profile for the phosphorus. The furnace and ampoule are placed within a pressure chamber having provisions for pressurizing, electrical connections, water circulation, and temperature measurement.

It is therefore an object of this invention to provide a process of synthesizing indium phosphide in a substantially shorter time than previous.

It is another object of the present invention to provide an apparatus for the synthesis of InP having independently controlled heating zones in the reaction and volatile zones.

Another object of the present invention is an apparatus that permits the accurate control of pressure/temperature in the volatile zone.

Another object of the present invention is to provide an apparatus having a cooling baffle and a heat pipe in the volatile zone to make the temperature independently controlled therein.

These and many other objects and advantages of the present invention will be readily apparent to one skilled in the pertinent art from the following detailed description of a preferred embodiment of the invention and the related drawings.

DETAILED DESCRIPTION OF THE PREFERRED EMBODIMENT

Figure 1:
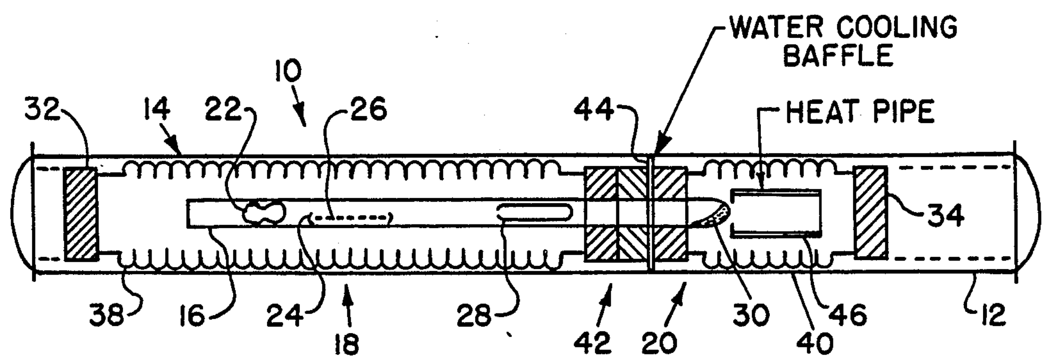
FIG. 1 illustrates the position of the ampoule and furnace in a pressure chamber of the present invention.

Referring to FIG. 1, a partial illustration of crystal growth apparatus 10 is shown. Growth apparatus 10 of the present invention includes a pressure chamber 12, see FIG. 5, a furnace 14, and a quartz ampoule 16, see FIG. 6. Although this invention describes the synthesis of indium phosphide other compounds such as GaAs, GaP, HgCdTe, for example, can be synthesized by this crystal growth apparatus 10.

Ampoule 16 has a reaction zone 18 therein and a volatile zone 20. Ampoule 16 has a quartz sealing plug 22. In reaction zone 18 is a quartz boat 24 for holding indium 26 therein and a temperature/pressure baffle 28. In volatile zone 20 is placed phosphorus 30. As phosphorus 30 is heated by furnace 14, phosphorus gas flows past baffle 28 and reacts with indium 26 in boat 24 to form indium phosphide.

Furnace 14 has two end insulation caps 32 and 34 attached to heating coils 38 and 40. Reaction zone 18 and volatile zone 20 are separated by a series of insulation rings 42 being baffles to the transfer of heat and having in between a water cooling baffle 44. Insulating rings 42 should fit closely within the walls of pressure chamber 14 to further impede the flow of gases thereby. A cylindrical heat pipe 46 is positioned near volatile zone 20 of ampoule 16 in order to maintain a constant temperature as to be determined.

High pressure synthesis of volatile chemicals is complicated by the large heat transfer coefficient of the high pressure gas used in pressure chamber 12. Active water cooling is essential for controlling of the pressure of the volatile constituent such as phosphorus 30. This method permits control of the temperature by two independent mechanisms: controlling the flow of cooling water and/or adjusting the power of the heater in the volatile zone 20.

Without water cooling baffle 44 the temperature of volatile zone 20 rises to a temperature that would quickly rupture the sealed quartz ampoule 16. Passive temperature/pressure control by thick layers of insulation was found to be ineffective and explosions of the ampoules did occur.

Figure 4:
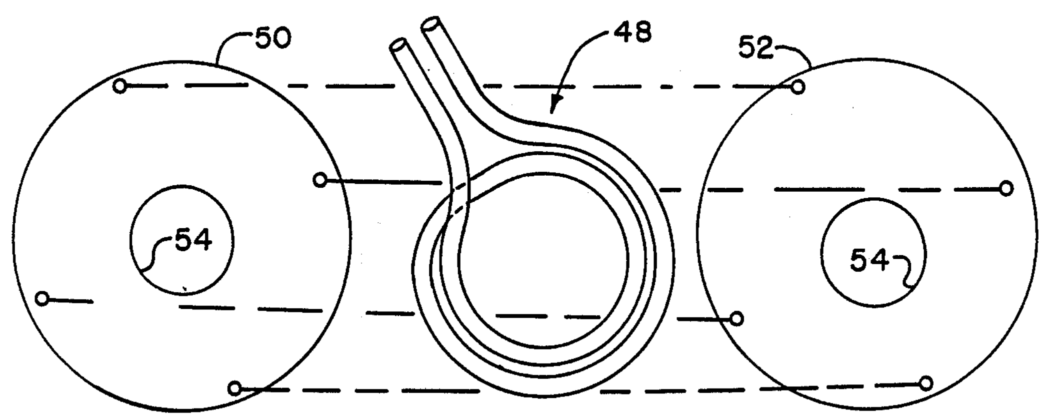
FIG. 4 illustrates the water cooling baffle used in the furnace.
Figure 5:
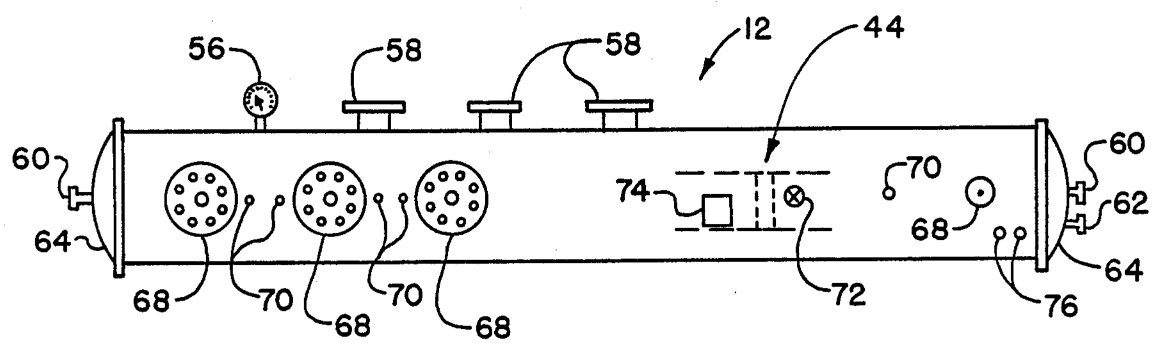
FIG. 5 illustrates the pressure chamber used in the present invention.

Active water cooling is achieved by baffle 44 shown in FIGS. 4 and 5. The water is brought into pressure chamber 12 via Parker compression fittings. The ¼" copper tubing is formed into a flat coil 48 and mounted coaxially between two copper plates 50 and 52. Holes 54 in plates 50 and 52 allow ampoule 16 to pass closely therethrough. Plates 50 and 52 fit closely within pressure chamber 12 to prevent the flow of gas thereby. This baffle 44 prevents any conductive heat transfer to volatile zone 20 thereby eliminating the long waiting period between process changes and stabilizing temperature.

Water cooling baffle 44 has significantly reduced the time required for processing vital III–V compounds. This time/cost savings is further appreciated by the improved yield of product now that the possibility of explosions has been drastically reduced.

Ampoule 16 and furnace 14 are mounted in a pressure chamber 12 as seen in FIG. 5. External devices connected to chamber 12 are not shown but are considered conventional. Chamber 12 has pressure relief valves 72 and 74. One being a 500 psig valve where chamber 12 is able to hold about 700 psig. A pressure gauge 58 provides a visual monitor. Boat 24 is viewed through ports 58. Fixed thermocouples are placed in ports 70 and movable thermocouples are placed in ports 60. Pressurized gas such as nitrogen is input through port 62 and cooling water is circulated through ports 72 to water cooling baffle 44.

Figure 2:
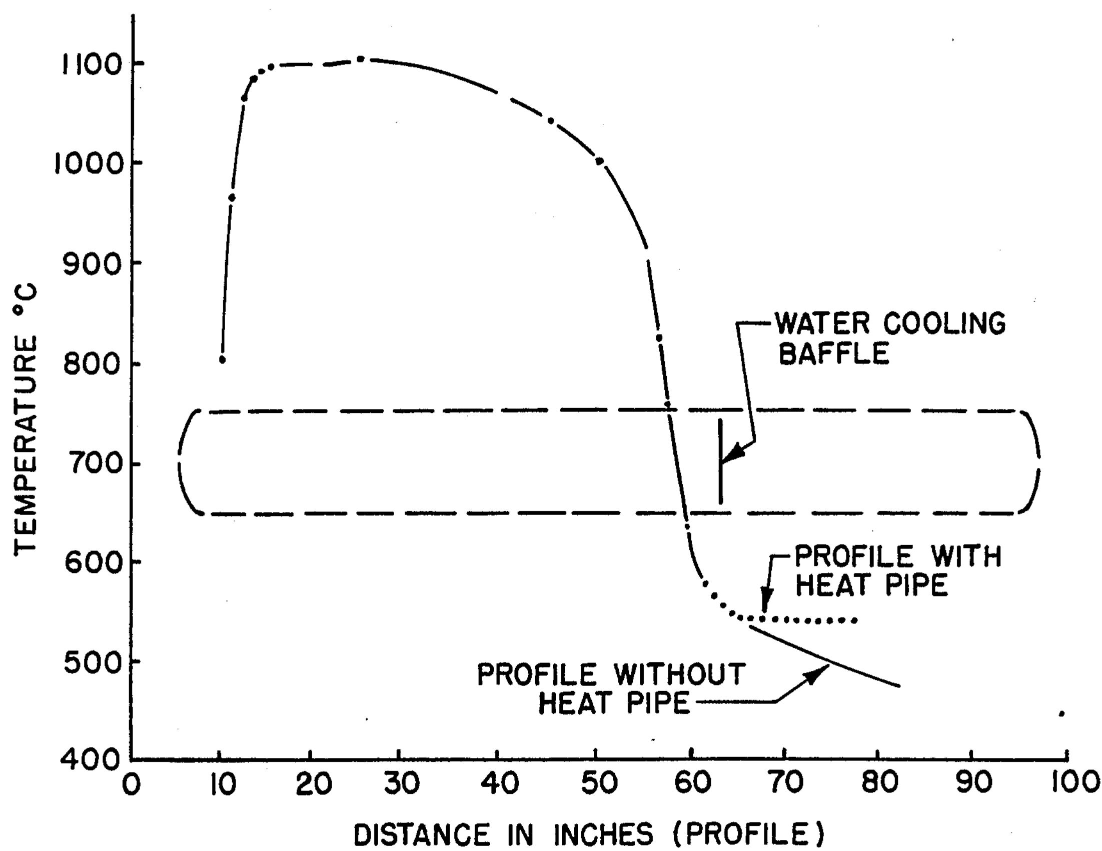
FIG. 2 illustrates the temperature gradient in the apparatus of FIG. 1.
Figure 6:
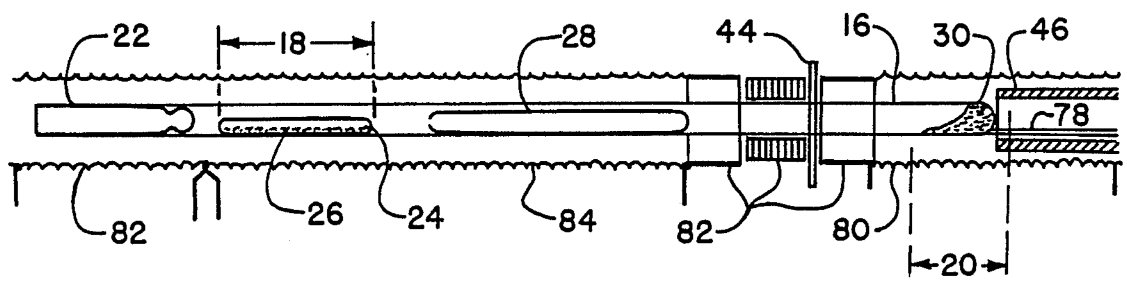
FIG. 6 illustrates further the heating zones about the ampoule of the present invention.

Referring to FIG. 6, the temperature gradient in reaction zone 18 is established by means of heater 82 and 84. The profile for such is shown in FIG. 2. The temperature profile for volatile zone 20 is established by a heater 80 in conjunction with cooling baffle 44. The temperature gradient over the length of pressure chamber 12 is shown in FIG. 2.

EXPERIMENTAL PROCEDURE

Cleaning procedures for the Amersil quartz ampoule 16 is described in Adamski, J. A., *J. Crystal Growth*, 64(1981) 1–9. The final vacuum bakeout conditions for the empty ampoule 16 are: T=1,000° C. for 3 hours at $3\times10^{-7}$ Torr.

The red phosphorus 30 is loaded through a long stemmed funnel to prevent its sticking to the quartz walls in the indium reaction zone 18. A vented quartz tube 28 is positioned behind the phosphorus volatile zone 20 as a convection and radiation baffle. The loaded indium boat 24 (200 gms) is placed in the ampoule 16 at a specific position as determined by the temperature profile, FIG. 2. A gold tube furnace 14 (Transtemp Co.) is mounted coaxially around the indium reaction zone 18 and the ampoule 16 is evacuated to $1\times10^{-7}$ Torr. The indium 26 is vacuum baked at 850° C. for six hours and then ampoule 16 is sealed with quartz plug 22.

The high pressure gas of pressure chamber 12 has a strong effect on the shape of the temperature profile. This demanded active cooling by water baffle 44 in front of low temperature heat pipe 46 (Dynatherm) in order to control the temperature and pressure of the phosphorus reservoir. Temperature profiles had to be obtained at high pressure to accurately reflect the synthesis environment. Five thermocouples such as thermocouple 78 were placed directly against the outer surface of the ampoule 16. Errors of 100° C. were observed when one of the thermocouples 78 was inadvertently positioned 8 mm away from the surface. A sixth thermocouple 78 was mounted inside a thick walled inconel tube and could be freely moved down the entire length of the interior of hot zone, FIG. 6. Temperature xeasurements were made at 1.0" intervals, FIG. 2.

Figure 3:
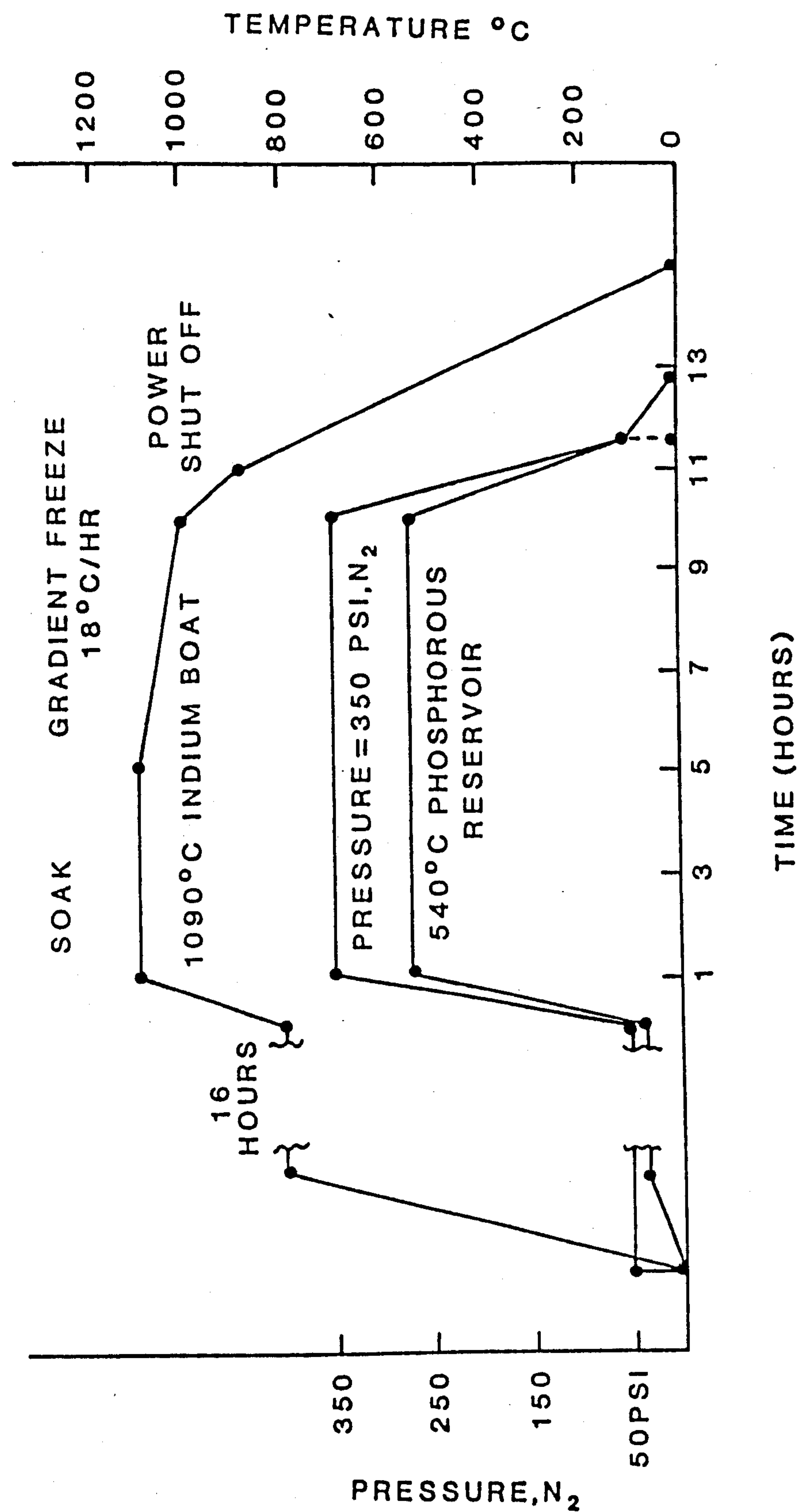
FIG. 3 illustrates the pressure/temperature schedule in making InP with the apparatus of the present invention.

The loaded furnace 14 is twice flushed with $N_2$ to reduce the $O_2$ content before pressurizing to 50 psi. The indium reaction zone 18 is preheated to 800° C. for 16 hours being heated by heaters 82 and 84. This heating causes a temperature increase in the phosphorus volatile zone 20 of only 50° C. under current operating conditions. The reaction cycle begins by heating indium 24 and phosphorus 30 zones 18 and 20 concurrently for one hour. The volatile zone 20 temperature increased from 70° to 540° C., FIG. 3, and the In reaction zone 18 increased from 800° to 1090° C. The $N_2$ back-pressure is adjusted continuously according to Bachmann's data to avoid large physical stresses in the ampoule 16 wall. The maximum pressure of $N_2$ is only 350 psi where 405 psi is predicted for the vapor pressure of phosphorus over InP at 540° C. Defect free quartz ampoules with a 2 mm wall thickness will withstand overpressures greater than 8 atm at 1100° C. The heated ampoule 16 is soaked at these temperatures and pressure for four hours to allow time for a complete reaction of indium 26.

The cooling program is designed to promote grain growth under gradient freeze conditions. The indium reaction zone 18 is cooled from 1090° C. to 1000° C. over 5 hours, during which time, the contents of boat 24 have directionally solidified. The indium reaction zone 18 is then cooled to 900° C. in 60 minutes to reduce the equilibrium vapor pressure of phosphorus 30 over the solid InP. At this time the power in all three heaters, 82, 84, and 80 is turned off and the pressure is adjusted according to the falling temperature readings from the phosphorus reservoir. After 90 minutes, the phosphorus volatile zone 20 has cooled below 400° C. (2 atm) and the danger of explosion is removed.

Seven high pressure synthesis runs were conducted. There were two temperature/pressure excursions resulting in phosphorus explosions. The addition of the potassium filled heat pipe 46 and water baffle 44 permitted precise temperature control of the phosphorus volatile zone 20, and thus eliminated ampoule 16 failures. The temperature of the phosphorus volatile zone 20 can be adjusted over a wide range by varying the flow of chilled water at a fixed power input.

Van de Pauw measurements were made on selected wafers from an LEC crystal pulled from an ingot (Table 1). These values are consistent with the low pressure Bridgman synthesis.

Polycrystalline wafers cut from the first to freeze portion of HP 5, HP 6 and HP 7 were analyzed by two other techniques to identify quantitatively the chemical nature of the ionized impurities discovered in the Hall measurements. Atomic Absorption Spectroscopy (AAS) and Emission Mass Spectrometry (EMS) analyses were performed at Eagle-Picher (Miami, Okla.) under the direction of Dr. Arsdel Fluesmeier. Both of these techniques, however, were unable to detect sulphur, which is the dominant impurity in high mobility InP (Table 2).

TABLE 1

| SAMPLE NUMBER | $\mu_{77K}$ $CM^2/V$-SEC | $\mu_{300K}$ $CM^2/V$-SEC | $n \times 10^{15}$ |
|---|---|---|---|
| HP-1 | 29,500 | 4974 | 2.4 |
| HP-2 | 35,100 | 4428 | 4.1 |
| HP-5 | 21,500 | 3355 | 6.0 |
| HP-6 | 32,900 | 4154 | 4.3 |

TABLE 2

| | | Si | Fe | Al | Cu | Zn |
|---|---|---|---|---|---|---|
| HP-5 | AAS | ND | 11 | 5 | 4 | 1 |
| | EMS | 32 | 18 | 75 | 1 | ND |
| HP-6 | AAS | ND | 9 | 7 | 4 | 1 |
| | EMS | 30 | 10 | 38 | 1 | ND |
| HP-7 | AAS | ND | 9 | 7 | 3 | 1 |
| | EMS | 24 | 10 | 80 | 1 | ND |

ND = Not Determined
AAS and EMS values are in parts per million

Vacuum baking of indium 26 has reduced the concentration of Si and S below $1\times10^{15}$. The as delivered phosphorus has now become the limiting factor in purification studies. Future purification studies will be directed towards improvement of the as delivered phosphorus.

The In in synthesis run nos. HP 5, 6, and 7 was completely reacted with P, but the charge failed to solidify directionally. Supercooling of the InP melt was observed to exceed 100° C. before rapid uniaxial solidification ensued. This mode of freezing eliminates the purifying mechanism of directional segregation, but it is direct evidence of a clean, precipitate free melt surface.

The addition of a water cooling baffle 44 coupled with a low temperature heat pipe 46 at the end of the phosphorus reservoir permit precise control of temperature and internal pressure. Complete, rapid synthesis of InP can be achieved in a reproducible manner. Prepurification of the elements prior to synthesis is needed to reduce the ionized impurity level below $10^{15}/cm^3$. The implementation of a pressure transducer and automatic solenoid valve to balance internal/external pressures will allow for the complete automation of this process.

Clearly, many modifications and variations of the present invention are possible in light of the above teachings and it is therefore understood, that within the inventive scope of the inventive concept, the invention may be practiced otherwise than specifically claimed.

What is claimed is:

1. A semiconductor crystal apparatus comprising:

a pressure chamber, said pressure chamber having pressure monitoring means operably connected thereto, pressure adjusting means operably connected thereon, a source of pressurized gas operably connected thereto, temperature measuring means operably connected thereto, viewing ports connected thereon, water circulation ports operably connected thereon, and electrical feed-through ports operably connected therethrough, said pressure chamber having a cylindrical longitudinal cavity therethrough;

a first heating means, said first heating means being at least one heating coil about a reaction zone within said cavity, said heating coil having an insulating cap on a first end in close proximity to said heating coil;

a first insulating means, said first insulating means being at least one insulating ring, said at least one insulating ring being positioned near a second end of said first heating means, said insulating ring being in close proximity to a wall of said pressure chamber to impede the flow of gases thereby, said at least one insulating ring having a cylindrical hole through the center thereof;

a baffle for controlling temperature and pressure, said baffle being positioned adjacent to said at least one insulating ring on a side opposite to said first heating means, said baffle being in close proximity to said wall of said pressure chamber to impede the flow of gases thereby, said baffle having a cylindrical hole through the center thereof, said baffle preventing the flow of pressurized heated gas thereby so that independently heated zones are established on opposite sides of said baffle, said baffle furthering comprising:

a pair of circular plates, each of said circular plates having a centrally located hole therethrough for an ampoule, said plates further having means for securing said plates together, and a cooling coil, said cooling coil being a flat coil of tubing for conducting cooling fluid therethrough, said flat coil being held between said circular plates, said cooling coil having an input end and an output end, said ends being connected to said water circulation ports of said pressure chamber;

a second insulating means, said second insulating means being on the opposite side of said baffle than said first insulating means, said second insulating means being an insulating ring in close proximity to said wall and having a cylindrical hole through the center thereof;

a second heating means, said second heating means being a heating coil about a volatile zone, a first end of said second heating means being in close proximity to said second insulating means, a second end of said second heating means having an insulating cap thereon;

a heat pipe, said heat pipe positioned in said voltile zone to insure a constant temperature profile therein;

an ampoule, said ampoule being positioned within said reaction zone, in said holes of said first and said second insulating means, in said hole of said baffle, and within said volatile zone, said ampoule having a closed end and a sealable open end, said sealable open end being sealed by a sealing plug positioned therein, said closed end being positioned near said heat pipe and having a first semiconductor material placed therein within said volatile zone, said ampoule substantially impeding the flow of heated gases through said holes; and a boat, said boat holding a second semiconductor material, said boat being selectively positioned within said ampoule in said reaction zone.

* * * * *